United States Patent
Tanaka (10) Patent No.: US 7,428,958 B2
(45) Date of Patent: Sep. 30, 2008

(54) SUBSTRATE CONVEYOR APPARATUS, SUBSTRATE CONVEYANCE METHOD AND EXPOSURE APPARATUS

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 220 days.

(21) Appl. No.: 11/273,021

(22) Filed: Nov. 15, 2005

(65) Prior Publication Data

US 2006/0291982 A1    Dec. 28, 2006

Related U.S. Application Data

(60) Provisional application No. 60/721,128, filed on Sep. 28, 2005.

(30) Foreign Application Priority Data

Nov. 15, 2004    (JP) .............................. 2004-330356

(51) Int. Cl.
*B65G 47/34* (2006.01)

(52) U.S. Cl. .............................. 198/468.9; 198/468.01; 414/217

(58) Field of Classification Search .............. 198/346.3, 198/343.2, 468.01, 468.4, 468.6, 468.8, 468.9; 414/217, 939, 222.07, 222.12, 225.01
See application file for complete search history.

(56) References Cited

U.S. PATENT DOCUMENTS

| | | | |
|---|---|---|---|
| 4,534,695 A * | 8/1985 | Stump et al. ............. | 198/346.2 |
| 4,984,953 A | 1/1991 | Nakazato et al. | |
| 5,538,390 A * | 7/1996 | Salzman ..................... | 414/217 |
| 5,695,564 A * | 12/1997 | Imahashi .................... | 414/217 |
| 6,090,176 A | 7/2000 | Yoshitake et al. | |
| 6,185,815 B1 * | 2/2001 | Schindler ................. | 198/468.4 |
| 6,239,863 B1 | 5/2001 | Catey et al. | |
| 6,281,510 B1 | 8/2001 | Yoshitake et al. | |
| 6,317,479 B1 | 11/2001 | Chiba et al. | |
| 6,646,720 B2 | 11/2003 | Ramamoorthy et al. | |
| 6,728,332 B2 | 4/2004 | Chiba et al. | |
| 6,753,945 B2 | 6/2004 | Heerens et al. | |
| 6,826,451 B2 | 11/2004 | del Puerto et al. | |
| 6,906,783 B2 | 6/2005 | del Puerto et al. | |
| 6,912,043 B2 | 6/2005 | Galburt | |

(Continued)

FOREIGN PATENT DOCUMENTS

JP    S63-208414    8/1988

(Continued)

OTHER PUBLICATIONS

Japanese Search Report dated Feb. 14, 2006 for International Application No. PCT/JP2005/020704, 2 pages.

*Primary Examiner*—James R Bidwell
(74) *Attorney, Agent, or Firm*—Finnegan, Henderson, Farabow, Garrett & Dunner, L.L.P.

(57) ABSTRACT

A substrate conveyor apparatus carries a substrate such as reticle. A substrate conveyance method and an exposure apparatus reliably adhere a substrate to the lower surface of a chuck. A movable stage can move in the horizontal direction and is equipped with a chuck having an adhesion surface that faces down for adhering a substrate. An up-down means equipped with an up-down table is positionable in a position below the substrate and within the movement range of the movable stage, and a conveyance means equipped with a conveyor arm carries the substrate to the up-down means.

31 Claims, 10 Drawing Sheets

U.S. PATENT DOCUMENTS

| | | | |
|---|---|---|---|
| 2003/0162101 A1 | 8/2003 | Heerens et al. | |
| 2003/0227605 A1 | 12/2003 | del Puerto et al. | |
| 2004/0197169 A1* | 10/2004 | Soraoka et al. | 414/217 |
| 2005/0057740 A1 | 3/2005 | del Puerto et al. | |
| 2005/0163598 A1* | 7/2005 | Yuasa et al. | 414/217 |
| 2005/0231707 A1 | 10/2005 | Galburt | |

FOREIGN PATENT DOCUMENTS

| | | |
|---|---|---|
| JP | 4-190408 A | 7/1992 |
| JP | H06-002699 | 1/1994 |
| JP | 2002-353099 A | 12/2002 |
| JP | 2003-65745 A | 3/2003 |
| JP | 2004-153122 A | 5/2004 |

* cited by examiner

SUBSTRATE CONVEYOR APPARATUS, SUBSTRATE CONVEYANCE METHOD AND EXPOSURE APPARATUS

CROSS REFERENCE TO RELATED APPLICATIONS

This application claims the priority of Japanese Patent Application No. 2004-330356, filed on Nov. 15, 2004, and the benefit of U.S. Provisional Application No. 60/721,128, filed on Sep. 28, 2005, the contents of which are incorporated herein by reference.

BACKGROUND OF THE INVENTION

1. Field of the Invention

The present invention pertains to a substrate conveyor apparatus that carries substrates such as reticles, to a substrate conveyance method and to a substrate conveyor apparatus.

2. Brief Description of the Prior Art

In prior art, as shown in Patent Literature 1, for example, a substrate conveyor apparatus that carries a reticle below a reticle stage by means of a conveyor arm and holds the reticle to the lower surface of a static chuck that is fixed to the lower side of the reticle stage is known.

Patent Literature 1: Unexamined Japanese Patent Application Publication H11-74182 Official gazette.

However, with the conveyor arm normally used in the substrate conveyor apparatus of Patent Literature 1 and the like, the vertical positioning precision is inferior compared to the horizontal positioning precision; therefore there is the problem that it is difficult to reliably adhere the reticle to the lower surface of the static chuck.

The present invention is intended to resolve the conventional problems concerned, therefore the object is to provide a substrate conveyor apparatus and a substrate conveyance method that can reliably adhere the substrates to the lower surface of the chuck. Also, it has the object of providing an exposure apparatus using this substrate conveyor apparatus.

SUMMARY OF THE INVENTION

The substrate conveyor apparatus of claim 1 is a substrate conveyor apparatus equipped with a movable stage that can move in the horizontal direction and that is equipped with a chuck having an adhesion surface that faces down for adhering a substrate, and a fixed blind disposed below the movable stage; characterized in that the movable stage moves in the horizontal direction in a position separated from the fixed blind to attach and remove the substrate.

The substrate conveyor apparatus of claim 2 is, with respect to a substrate conveyor apparatus described in claim 1, characterized by having an up-down means equipped with an up-down table that is positionable in a position below the movable stage, and a conveyance means that is equipped with a conveyor arm that carries the substrate to the up-down means.

The substrate conveyor apparatus of claim 3 is, with respect to a substrate conveyor apparatus described in claim 2, characterized in that the conveyor arm carries the substrate, which is housed in a protection pod that can be divided into a base member and a cover member, separated from the cover member to the up-down table along with the base member.

The substrate conveyor apparatus of claim 4 is, with respect to a substrate conveyor apparatus described in claim 3, characterized in that the up-down means is provided with a measurement means that measures the force operating on the up-down table.

The substrate conveyor apparatus of claim 5 is, with respect to a substrate conveyor apparatus described in any of claims 1 through 4, characterized by having a drop prevention means that prevents the dropping in error of the substrate adhered to the chuck.

The substrate conveyor apparatus of claim 6 is, with respect to a substrate conveyor apparatus described in claim 5, characterized by having a loss prevention member that is capable of rotation disposed on the movable stage side, a substrate retention means that rotates the loss prevention member and holds the substrate adhered to the chuck with the loss prevention member, and a release means that rotates the loss prevention member by raising the up-down table and releases the retention of the substrate by the loss prevention member.

The substrate conveyor apparatus of claim 7 is, with respect to a substrate conveyor apparatus described in claim 6, characterized in that the release means is a release member that extends, facing down, from the base member of the protection pod.

The substrate conveyor apparatus of claim 8 is, with respect to a substrate conveyor apparatus described in claim 6 or claim 7, characterized in that the movable stage disposes a fine motion table below a coarse motion stage so that it can move in the up and down direction and disposes the chuck below the fine motion table, and the substrate retention means is a retention member that extends facing down from the coarse motion stage.

The substrate conveyor apparatus of claim 9 is, with respect to a substrate conveyor apparatus described in any of claims 6 through 8, characterized by being equipped with a loss prevention member retention means that retains the loss prevention member in the retention position or the release position of the substrate.

The substrate conveyor apparatus of claim 10 is, with respect to a substrate conveyor apparatus described in claim 9, characterized in that the loss prevention member retention means retains the loss prevention member by means of a toggle mechanism using a hinge and spring.

The substrate conveyor apparatus of claim 11 is, with respect to a substrate conveyor apparatus described in claim 9, characterized in that the loss prevention member retention means retains the loss prevention member by magnetic force.

The substrate conveyance method of claim 12 is characterized by, after placing a substrate on an up-down table by means of a conveyor arm, moving a movable stage above the up-down table and adhering the substrate to the lower surface of a chuck of the movable stage by means of raising the up-down table.

The exposure apparatus of claim 13 is characterized by having a substrate conveyor apparatus described in any of claims 1 through 11.

In the substrate conveyor apparatus and method of the present invention, after a substrate is placed on an up-down table by a conveyor arm, a movable stage is moved above an up-down table and the substrate is adhered to the lower surface of a chuck on the movable stage by raising the up-down table. Accordingly, the substrate can be reliably adhered to the lower surface of the chuck.

In the exposure apparatus of the present invention, a substrate can be reliably adhered to the lower surface of a chuck; therefore a highly reliable exposure apparatus can be obtained.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE PREFERRED EMBODIMENTS

Below, we will explain the details of embodiments of the present invention. Reference will now be made in detail to the exemplary embodiments of the present invention, which are illustrated in the accompanying drawings. Wherever possible, the same reference numbers will be used throughout the drawings to refer to the same or like parts.

First Embodiment

Figure 1:
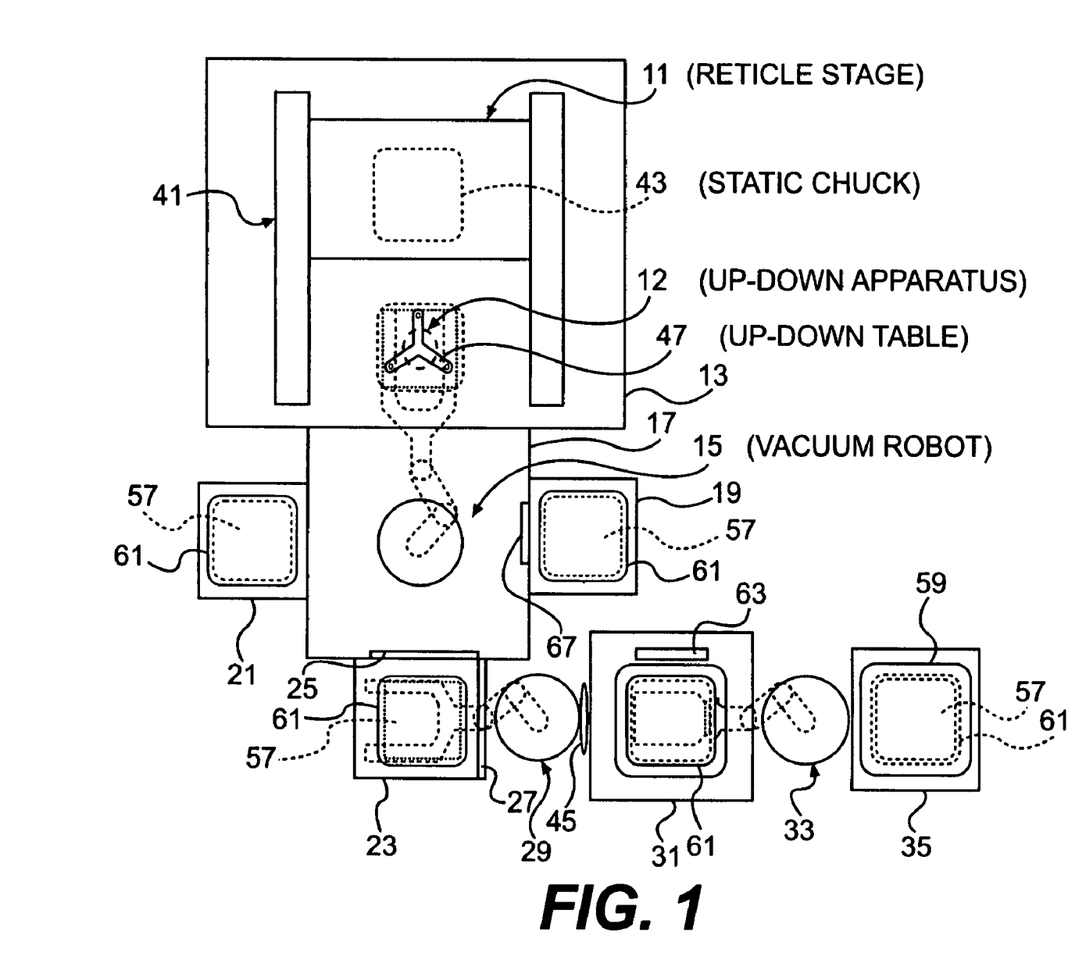
FIG. 1 is an illustration showing a first embodiment of the substrate conveyor apparatus of the present invention.

FIG. 1 shows a first embodiment of the substrate conveyor apparatus of the present invention.

This substrate conveyor apparatus has an exposure chamber 13 in which are disposed a reticle stage 11 and an up-down apparatus 12. On one side of exposure chamber 13 is provided a robot chamber 17 in which is disposed a vacuum robot 15. On one side of robot chamber 17 is provided a vacuum reticle library 19, and on the other side is provided a clean filter pod opener (hereafter called "CFP opener") 21. Exposure chamber 13, robot chamber 17, vacuum reticle library 19 and CFP opener 21 are in a vacuum atmosphere.

In the position on robot chamber 17 opposite exposure chamber 13, a load-lock cell 23 is disposed. Load-lock cell 23 communicates to robot chamber 17 via a second gate valve 25. In addition, it communicates to atmospheric air via a first gate valve 27.

On the outside of load-lock cell 23, a reticle carrier opener 31 is disposed via a second atmospheric air robot 29. On the outside of reticle carrier opener 31, an atmospheric air reticle library 35 is disposed via a first atmospheric air robot 33.

Figure 2:
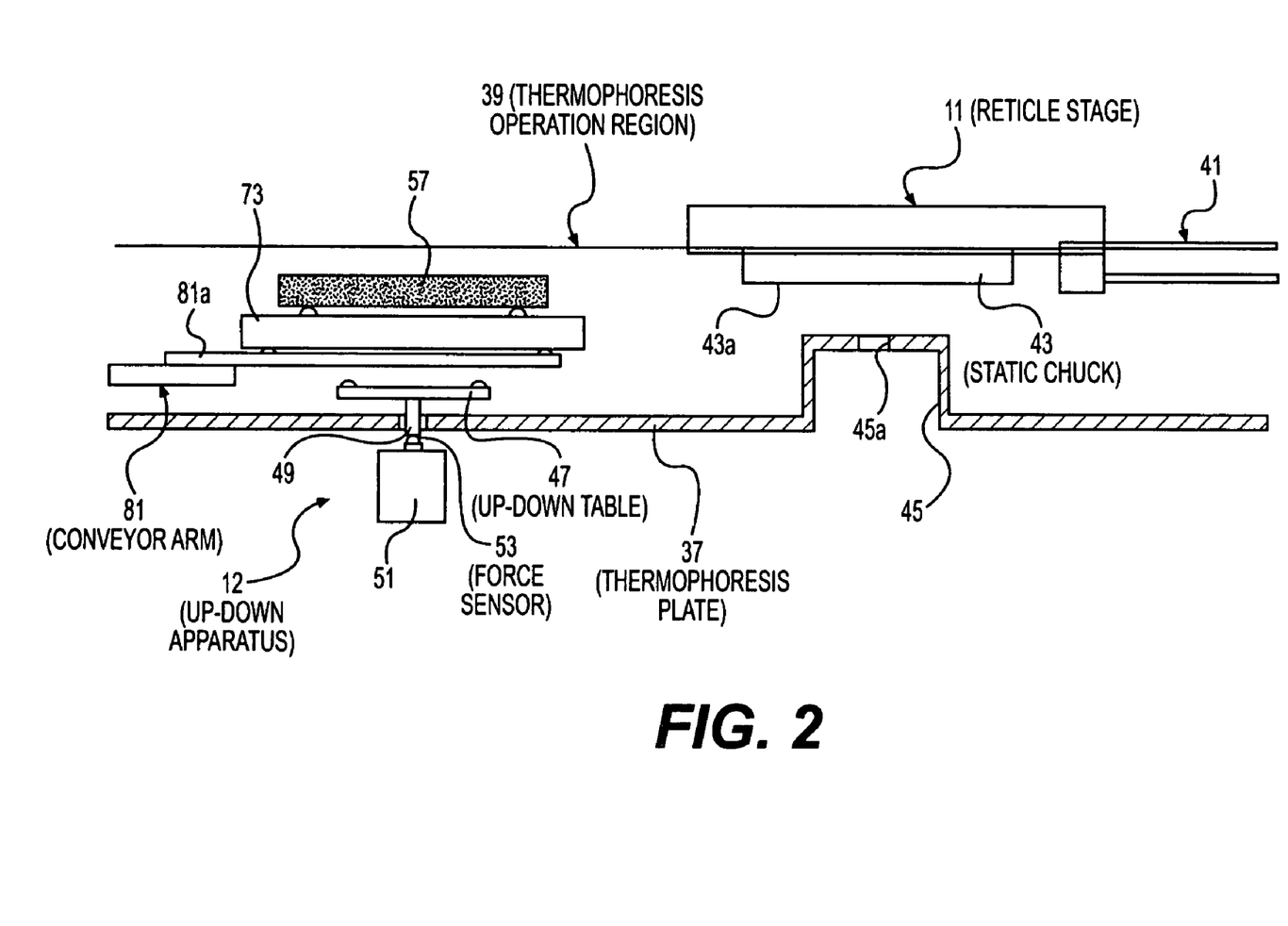
FIG. 2 is an illustration showing the details of the up-down apparatus and the reticle stage from FIG. 1.

FIG. 2 shows the details of the reticle stage 11 and up-down apparatus 12 disposed inside exposure chamber 13.

Reticle stage 11 is disposed above a thermophoresis plate 37. A thermophoresis plate 37 is cooled to a specified temperature by circulating a coolant. By cooling thermophoresis plate 37 in this way, fine contaminants move to the thermophoresis plate 37 side and a thermophoresis operation region 39 with very few contaminants is formed on the upper side of thermophoresis plate 37.

Reticle stage 11 is made as a movable stage that can be moved in a horizontal direction by a guidance means 41 (shown abbreviated). A static chuck 43 is fixed to the lower side of reticle stage 11. A fixed blind 45 is formed on thermophoresis plate 37, below static chuck 43. Fixed blind 45 extends in on the static chuck 43 side, and a hole part 45a is formed in its center that passes EUV light.

Up-down apparatus 12 has an up-down table 47. Up-down table 47 is disposed within thermophoresis operation region 39 on top of thermophoresis plate 37. In addition, it is disposed so that it can be positioned in a position below reticle stage 11. Up-down table 47 is supported by the upper end of an up-down shaft 49. Up-down shaft 49 penetrates and extends below thermophoresis plate 37, and a lift mechanism 51 that moves up-down shaft 49 is disposed on the lower end. A force sensor 53 that measures the force acting on up-down table 47 is provided on up-down shaft 49. This force sensor 53 consists of a stress gauge, a piezoelectric element, etc.

Figure 3:
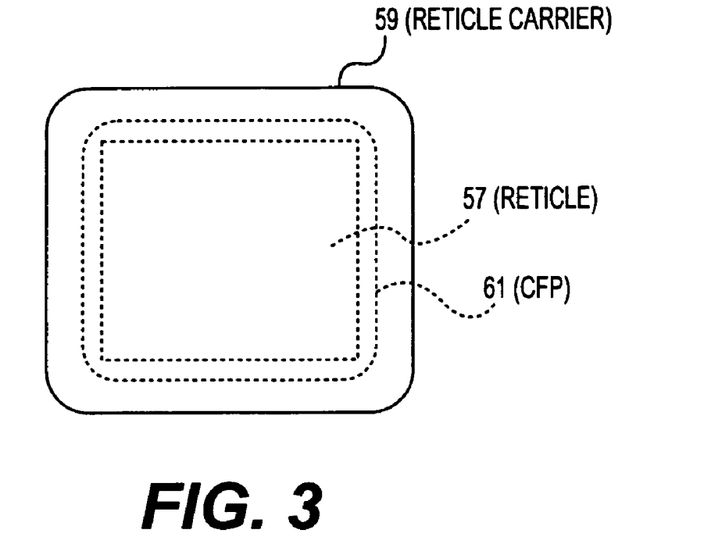
FIG. 3 is an illustration showing a reticle carrier.

In the above substrate conveyor apparatus, in atmospheric air reticle library 35, a reticle 57 for EUVL light that is used for exposure is placed in a state doubly protected by reticle carrier 59 and clean filter pod (hereafter called "CFP") 61 as shown in FIG. 3. CFP 61 has the function of a protective cover that protects reticle 57 in decompression atmosphere.

The reticle carrier 59, placed in atmospheric air reticle library 35, is carried to reticle carrier opener 31 by atmospheric air robot 33. Then, reticle carrier 59 is identified by reticle carrier ID reader 63. At this reticle carrier opener 31, reticle carrier 59 is opened and CFP 61 is exposed. The exposed CFP 61 is heated by about 2~3 degrees Celsius by means of a temperature compensation lamp 45. The heated CFP 61 is carried by second atmospheric air robot 29 to load-lock cell 23, where only the first gate valve 27 is opened. Note that the routes from reticle carrier opener 31 to load-lock cell 23 are in a clean environment.

In load-lock cell 23, vacuum drawing occurs for each CFP 61 while the first gate valve 27 and second gate valve 25 are closed. When a specified state of vacuum is achieved in load-lock cell 23, only second gate valve 25 opens and CFP 61 is conveyed to vacuum reticle library 19 by vacuum robot 15.

In vacuum reticle library 19, for example around 5 sheets of reticle 57 are stored housed in CFP 61. The reticles 57 are held at a specified temperature by a temperature adjustment mechanism (not shown). The reticles 57 stored in CFP 61 are identified by reticle ID reader 67. The identified reticles 57 are conveyed by vacuum robot 15 to CFP opener 21 while housed in a CFP 61.

In CFP opener 21, CFP 61 is opened and reticle 57 is exposed.

Figure 4:
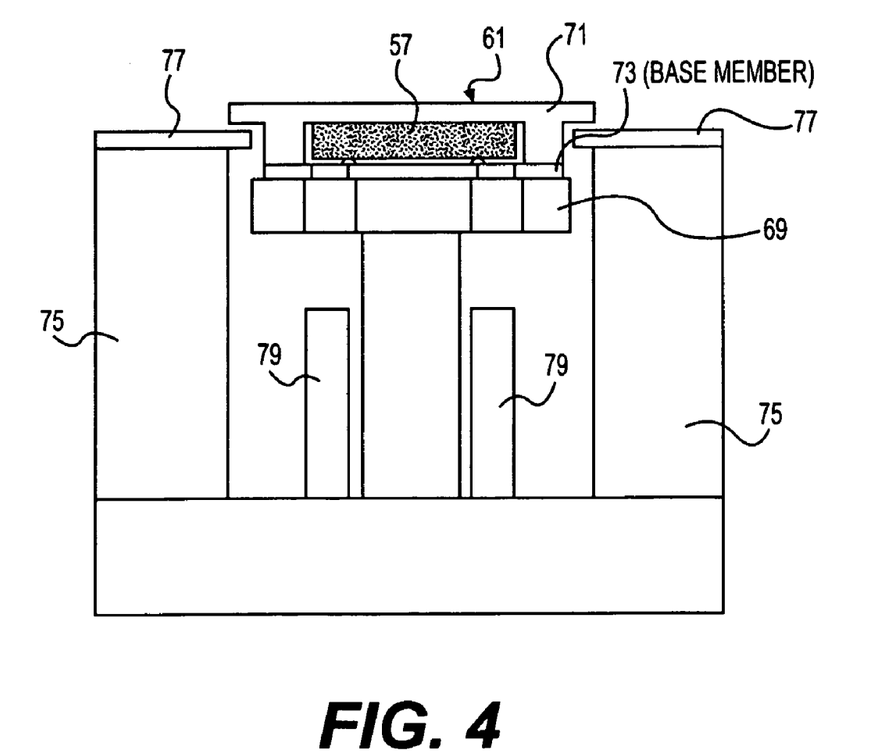
FIG. 4 is an illustration showing the details of the CFP stage from FIG. 1.
Figure 5:
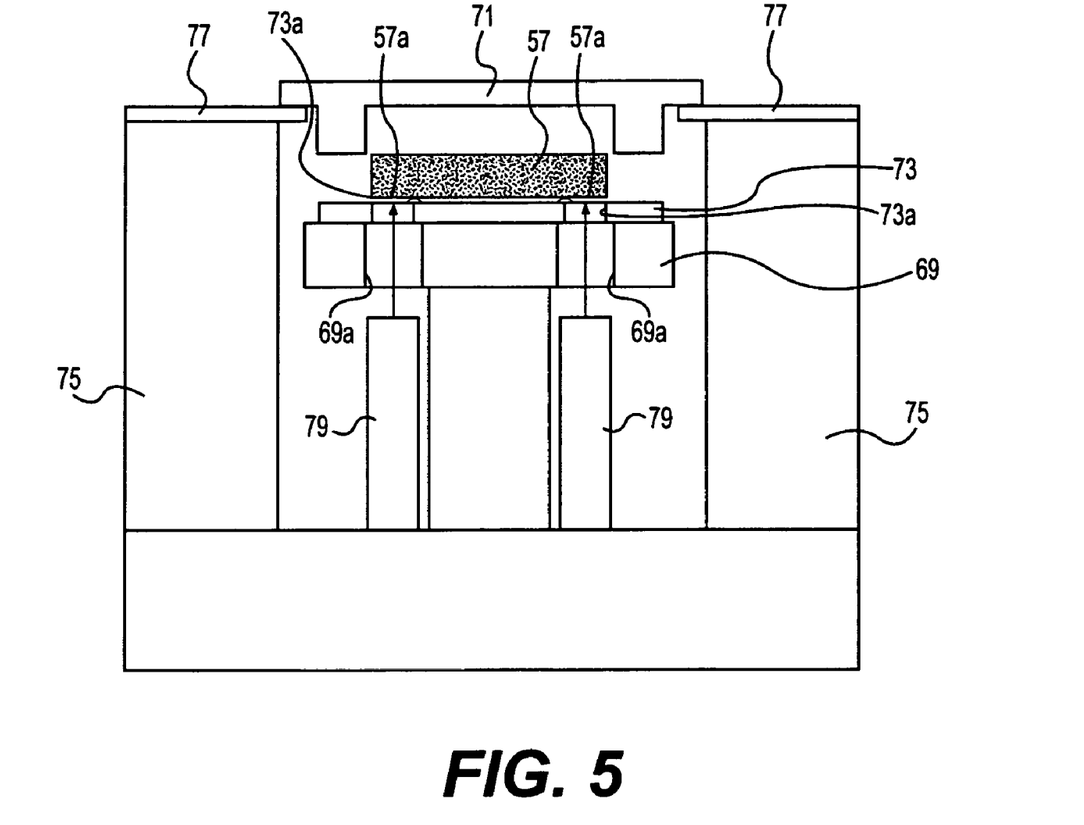
FIG. 5 is an illustration showing the state in FIG. 4 wherein a reticle is exposed from the CFP.

In this embodiment, as shown in FIG. 4, the CFP 61 conveyed to CFP opener 21 is set on a CFP stage 69. CFP 61 comprises cover member 71 and base member 73. Then, as shown in FIG. 5, by lowering CFP stage 69 the outer periphery of cover member 71 is locked by locking member 77 on the upper end of support member 75, exposing reticle 57.

In this embodiment, below CFP stage 69, a reference microscope 79 is disposed for performing pre-alignment of reticle 57. Then, a pre-alignment mark 57a formed on the lower surface of reticle 57 is detected by reference microscope 79 through a perforating hole 69a formed in CFP stage 69 and a transparent window 73a established in base member 73, and pre-alignment occurs by driving CFP stage 69. At this time, the reticle ID can be confirmed by detecting the reticle ID, such as a bar code, through the transparent window 73a in base member 73.

The reticle 57 that has completed pre-alignment, as shown in FIG. 2, is carried by an end effector 81a of conveyor arm 81 of vacuum robot 15 to up-down table 47 of up-down apparatus 12 while housed on the base member 73 of CFP 61.

Next, as shown in FIG. 6 (a), up-down shaft 49 is raised by lift mechanism 51 and base member 73 is placed on the upper surface of up-down table 47. By this means, end effector 81a is separated from base member 73.

Next, as shown in FIG. 6 (b), after end effector 81a retreats, up-down shaft 49 is lowered by lift mechanism 51 and base member 73 and reticle 57 are dropped. In this state, reticle stage 11 is moved immediately above reticle 57 by guidance means 41.

Figure 6A:
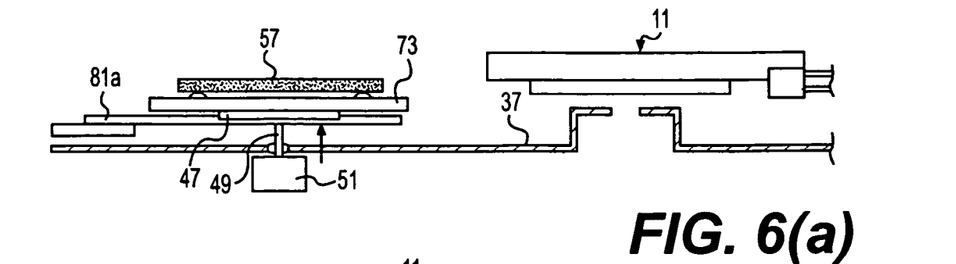
FIG. 6 is an illustration showing a state in FIG. 1 wherein the reticle is conveyed from a CFP stage to a reticle stage.
Figure 6B:
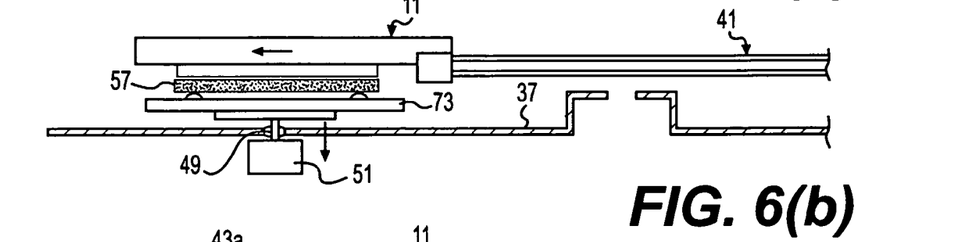
Figure 6C:
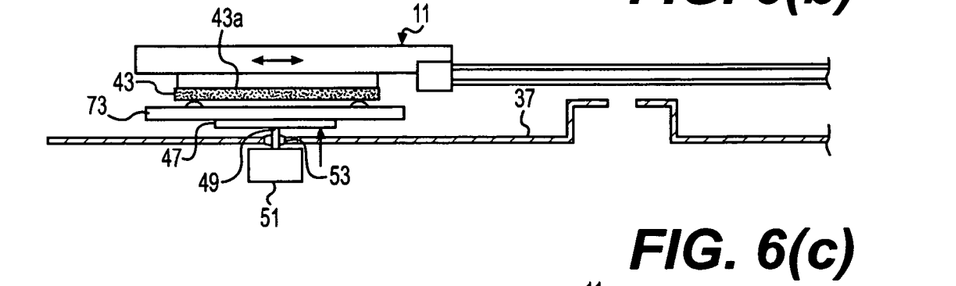
Figure 6D:
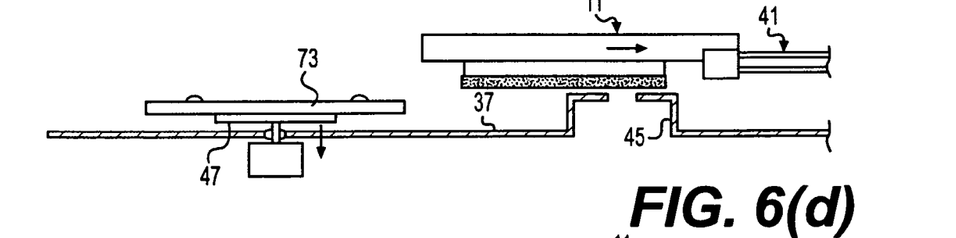
Figure 6E:
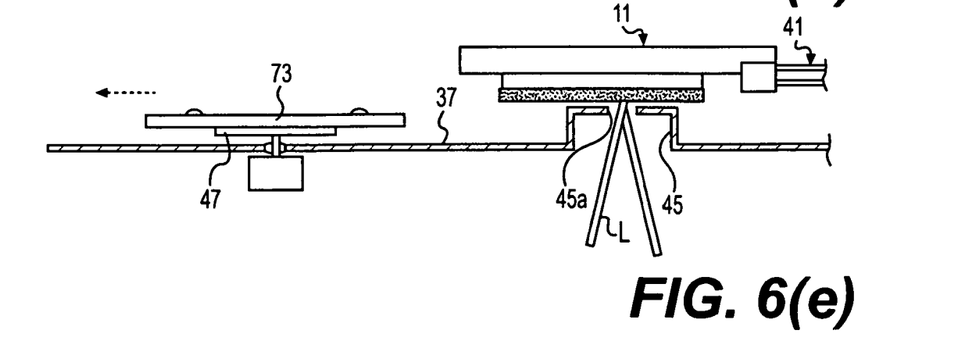

Next, as shown in FIG. 6(c), up-down shaft 49 is raised by lift mechanism 51, and reticle 57 is adhered to the lower surface of static chuck 43 of reticle stage 11. That is to say, the upper surface of reticle 57 is chucked to an adhesion surface 43a by turning on static chuck 43, in a state wherein reticle 57 is pressed onto the adhesion surface 43a of static chuck 43 by up-down table 47 via base member 73.

In this embodiment, the pressure when reticle 57 is pressed onto adhesion surface 43a of static chuck 43 is detected by force sensor 53, and reticle 57 is pressed onto adhesion surface 43 by a pre-determined pressure. Accordingly, reticle 57 can be reliably pressed onto adhesion surface 43a by the specified pressure.

Next, as shown in FIG. 6 (d), reticle stage 11 is moved to the fixed blind 45 side by guidance means 41. By this means, only base member 73 is left on up-down table 47.

Next, as shown in FIG. 6 (e), reticle stage 11 is moved to the exposure position immediately above fixed blind 45 by guidance means 41. At this time, the gap between the lower surface of reticle 57 and the upper surface of fixed blind 45 narrows to approximately 1 mm. Then, EUV light L is incident from the hole part of fixed blind 45, and exposure occurs by means of the EUV light L reflected by reticle 57.

Figure 7:
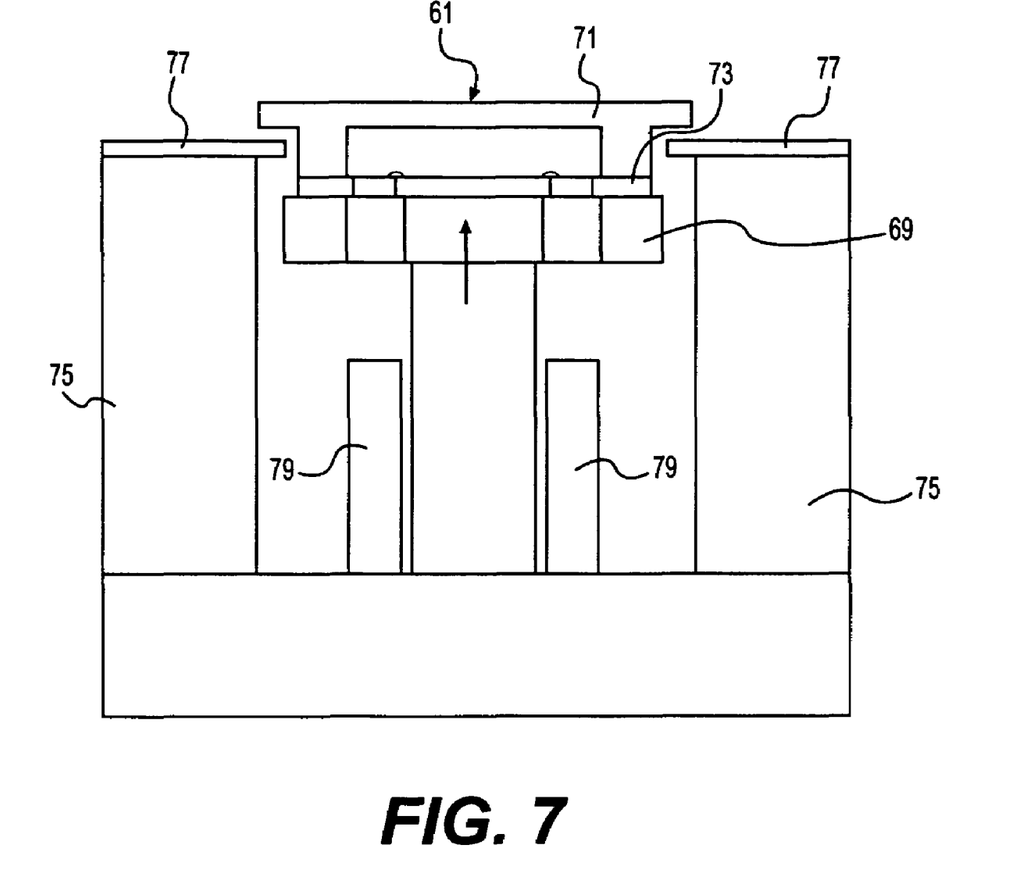
FIG. 7 is an illustration showing the state in FIG. 1 where the CFP is in standby in the CFP stage.

On the other hand, base member 73 on up-down table 47 is recovered by end effector 81a of conveyor arm 81. Conveyor arm 81 carries base member 73 to CFP opener 21, and as shown in FIG. 5 places base member 73 on CFP stage 69, which is in a dropped position. Then, as shown in FIG. 7, cover member 71 and base member 73 are sealed by raising CFP stage 69, and the interior of cover member 71 and base member 73 are sealed tight. By this means, contamination of base member 73 and cover member 71 is prevented.

When exposure is completed and the exchange of reticle 57 on reticle stage 11 occurs, cover member 71 and base member 73 of CFP 61, held in standby as shown in FIG. 7, are separated by dropping CFP stage 69 and dropping base member 73 (corresponding to the state without a reticle 57 in FIG. 5) and base member 73 is carried to up-down table 47 of up-down apparatus 12 by conveyor arm 81.

Then, after reticle stage 11 is moved above up-down table 47, reticle 57 is placed onto base member 73 by turning off static chuck 43 while reticle 57, which is adhered to static chuck 43, is in contact with base member 73. In this state, reticle 57 is carried to CFP opener 21 by conveyor arm 81, and base member 73 is placed on CFP stage 69, which is in the drop position as shown in FIG. 5. Then, cover member 71 and base member 73 of CFP 61 are sealed (refer to FIG. 4) by raising CFP stage 69, and CFP 61 is sealed tight while reticle 57 is held within CFP 61.

In the above embodiment, after reticle 57 is placed on up-down table 47 by conveyor arm 81, reticle stage 11 is moved above up-down table 47, reticle 57 is adhered to the lower surface of static chuck 43 of reticle stage 11 by raising up-down table 47, therefore reticle 57 can be quickly and reliably adhered to the lower surface of static chuck 43.

That is to say, with the above conveyor arm 81 of vacuum robot 15, vertical positioning precision is comparatively inferior to the horizontal positioning precision, so it is difficult to directly attach reticle 57 to the lower surface of static chuck 43 by conveyor arm 81. However, by adhering reticle 57 to static chuck 43 via up-down table 47, reticle 57 can be reliably adhered to the lower surface of static chuck 43.

In addition, in the above embodiment, when reticle stage 11 is moved to the exposure position, the gap between the lower surface of reticle 57 and the upper surface of fixed blind 45 is narrowed to approximately 1 mm. Accordingly, it is difficult to directly attach reticle 57 to the lower surface of static chuck 43 by conveyor arm 81 at the exposure position. However, by adhering reticle 57 to static chuck 43 by moving reticle stage 11 above up-down table 47, reticle 57 can be reliably adhered to the lower surface of static chuck 43.

Then, in the above embodiment, when reticle 57 is used in exposure, cover 71 and base 73 of CFP 61 are closed, and the inner surfaces of cover member 71 and base member 73 are concealed; therefore, when reticle 57 is used in exposure, contamination of the inner surface of CFP 61 can be easily and reliably prevented. Then, because the inner surface of CFP 61 is not contaminated, there is very little contamination of reticle 57.

Second Embodiment

Figure 8:
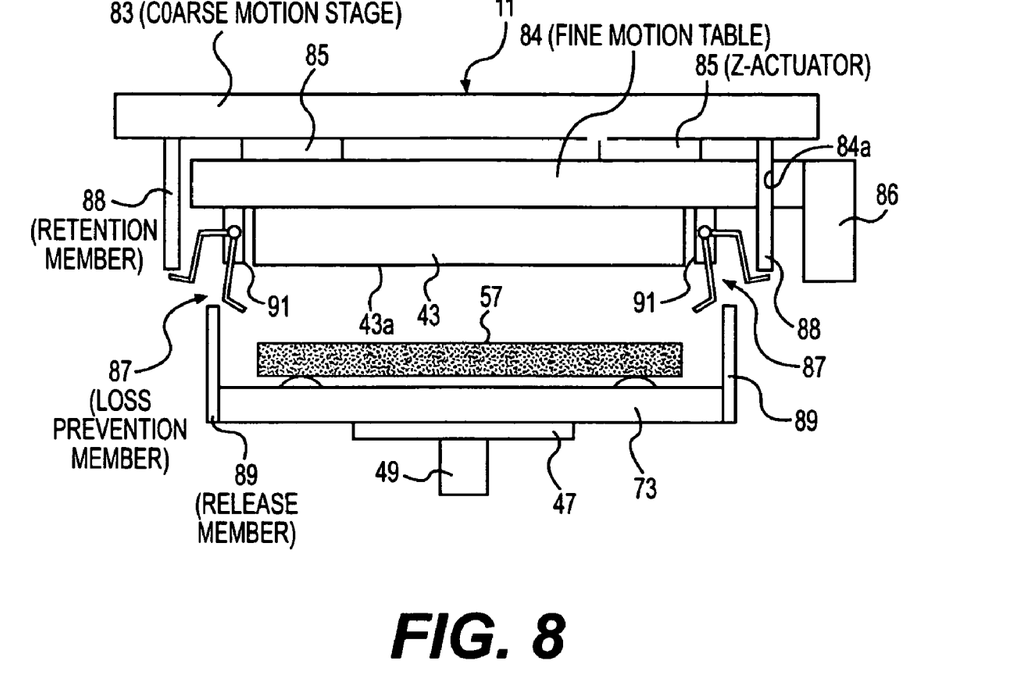
FIG. 8 is an illustration showing a second embodiment of the substrate conveyor apparatus of the present invention.

FIG. 8 shows a second embodiment of the substrate conveyor apparatus of the present invention.

Note that in this embodiment, the same members as in the first embodiment are assigned the same symbols, so detailed explanation has been omitted.

In this embodiment, reticle stage 11 has a coarse motion stage 83 and a fine motion table 84.

Rough motion stage 83 is made movable in the horizontal direction. Below coarse stage 83, a fine motion table 84 is disposed via a Z-actuator 85. Z-actuator 85 moves fine motion table 84 in the up and down direction. Fine motion table 84 is made rotatable in the horizontal direction, vertical direction and on the horizontal plane. A moving mirror 86 is fixed on the side surface of fine motion table 84 in order to measure the position of fine motion table 84. Static chuck 43 is fixed to the lower side of fine motion table 84 with adhesion surface 43a as the lower surface.

Then, in this embodiment, a drop prevention means is disposed on both sides of static chuck 43. This drop prevention means has a loss prevention member 87, a retention member 88 and a release member 89.

Loss prevention member 87 is disposed on a support member 91 fixed on both sides of the lower surface of fine motion table 84 so as to be rotatable. Retention member 88 is made in a pin shape and is fixed facing down on both sides of the lower surface of coarse stage 83. One side of retention member 88 is inserted into a perforating hole 84a formed on fine motion table 84. Release member 89 is made in the shape of a pin and is fixed facing up on both side surfaces of base member 73 of CFP 61.

Figure 9:
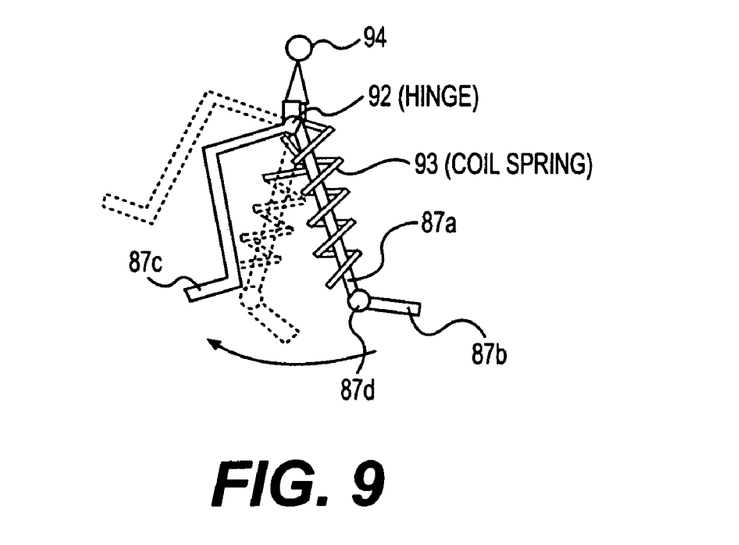
FIG. 9 is an illustration showing the details of the loss prevention member from FIG. 8.

FIG. 9 shows the details of loss prevention member 87.

Loss prevention member 87 has a U-shaped main body part 87a. A support talon 87b is formed on the static chuck 43-side of the end part of main body 87a. Also, a pressure part 87c is formed on the opposite end part of main body 87a. This loss prevention member 87 is made so as to be able to retain the two positions of the static chuck 43 side and the retention member 88 side by means of a toggle mechanism using a hinge 92 and a coil spring 93. In this embodiment, the lower end of coil spring 93 is fixed to the fixed part 87d of the root of retention talon 87b, and the upper end is fixed to fixed part 94 above hinge 92.

In this embodiment, attachment and release of reticle 57 to and from static chuck 43 occurs as shown in FIG. 10.

Figure 10A:
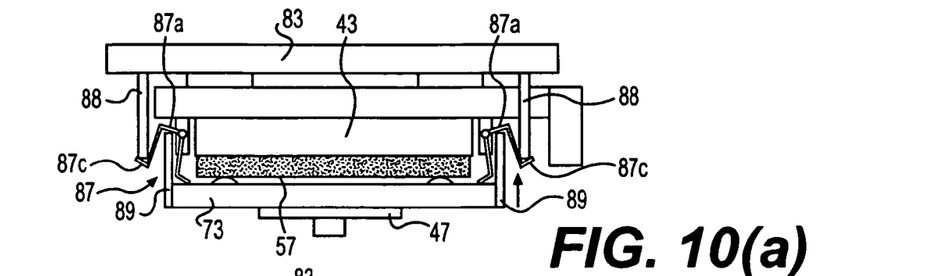
FIG. 10 is an illustration showing the method for attaching and removing the reticle from a static chuck.

First, as shown in FIG. 10(a), when up-down table 47 is raised, the release member 89 disposed on both sides of base member 73 of CFP 61 penetrates main body 87a of loss prevention member 87 and rotates toward the outside of loss prevention member 87. Then, in this state the reticle 57 placed on base member 73 is pressed to the lower surface of static chuck 43 and is adhered to static chuck 43. In this state, the lower end of retention member 88, affixed to coarse motion stage 83, is positioned adjacent to pressure part 87c of loss prevention member 87.

Figure 10B:
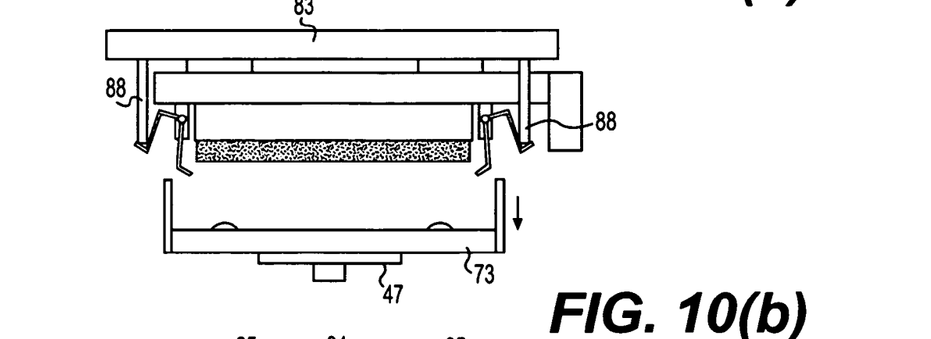

Next, as shown in FIG. 10(b), up-down table 47 is lowered and base member 73 of CFP 61 retreats.

Figure 10C:
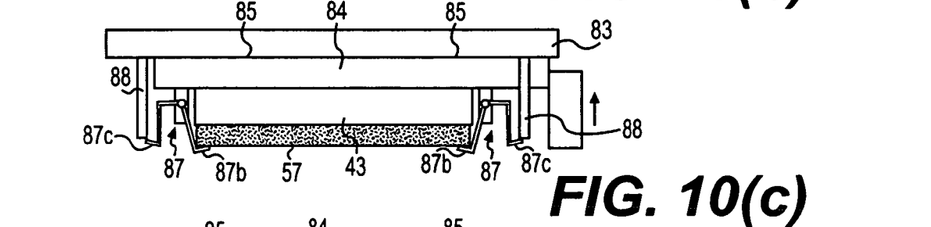

Next, as shown in FIG. 10(c), when fine motion table 84 is raised by Z-actuator 85, pressure part 87c of loss prevention member 87 is pressed by the lower end of retention member 88, and loss prevention member 87 rotates to the static chuck 43 side. By this means, retention talon 87b of loss prevention member 87 catches onto the outer periphery of reticle 57 adhered to static chuck 43, retaining reticle 57.

Figure 10D:
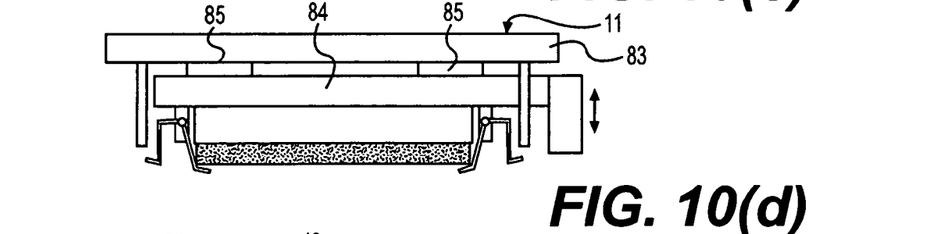

Next, as shown in FIG. 10(d), reticle stage 11 is moved to the exposure position, and exposure occurs after adjustment of the up-down position of fine motion table 84 by Z-actuator 85.

Figure 10E:
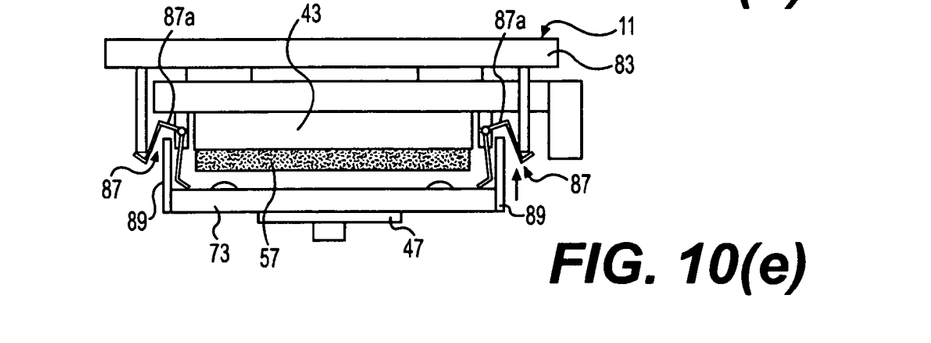

Next, as shown in FIG. 10(e), reticle stage 11 is positioned above up-down table 47, and by raising up-down table 47, release members 89 that are disposed on both sides of base member 73 of CFP 61 penetrate the main body 87a of loss prevention member 87 and rotate toward the outside of loss prevention member 87, and retention of reticle 57 is released by loss prevention member 87.

In this embodiment as well, a similar effect to that of the first embodiment can be obtained; however, in this embodiment reticle 57, which is adhered to static chuck 43, is retained by retention talon 87b of loss prevention member 87, thus the dropping in error of reticle 57 can be reliably prevented.

In addition, rotation of loss prevention member 87 occurs by means of retention member 88 and release member 89; thus, reliability can be improved in comparison to the case where loss prevention member 87 is rotated by electricity or by fluid.

Embodiment of an Exposure Apparatus

Figure 11:
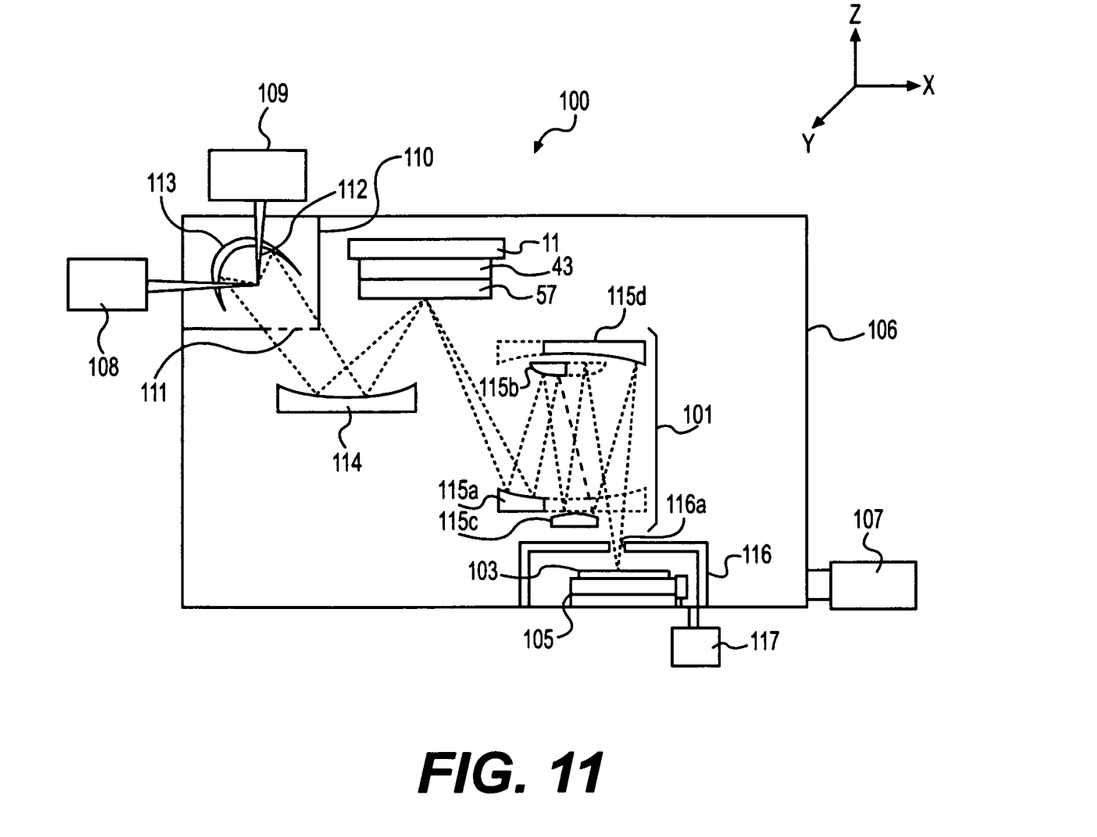
FIG. 11 is an illustration showing an embodiment of an exposure apparatus of the present invention.

FIG. 11 shows a typical EUV light lithography system within exposure chamber 13 in FIG. 1. Note that in this embodiment, the same members as in the first embodiment are assigned the same symbols. In this embodiment, EUV light is used as the exposure illumination light. EUV light has a wavelength of between 0.1 and 400 nm, and in particular for this embodiment a wavelength of approximately 1~50 nm is preferable. The projection image is one that uses an imaging optics system 101, thus it forms a reduced image of the pattern by means of reticle 57 on wafer 103.

The pattern irradiated onto wafer 103 is determined by the reflective-type reticle 57 disposed on the lower side of reticle stage 11 via static chuck 43. This reflective-type reticle 57 is carried in and out by vacuum robot 15 of the above embodiment (illustration of vacuum robot 15 is omitted). In addition, wafer 103 is placed on wafer stage 105. Typically, exposure is done by step and scan.

The permeability of the EUV light used as illumination light at the time of exposure is low in atmospheric air; therefore, the light path traversed by the EUV light is enclosed in a vacuum chamber 106 that maintains vacuum by using an appropriate vacuum pump 107. Also, the EUV light is generated by a laser plasma X-ray source. The laser plasma X-ray source is composed of a laser source 108 (operates as an excitement light source) and a xenon gas supply apparatus 109. The laser plasma X-ray source is surrounded by vacuum chamber 110. The EUV light generated by the laser plasma X-ray light source passes through window 111 in vacuum chamber 110.

Laser source 108 generates laser light having a wavelength lower than ultraviolet light, using, for example, a YAG laser or excimer laser. The laser light from laser source 108 is focused and irradiated in the flow of xenon gas (supplied from xenon gas supply apparatus 109) emitted from nozzle 112. When laser light is radiated in the flow of xenon gas, the laser light sufficiently heats the xenon gas, generating plasma. When the molecules of xenon gas excited by the laser fall into a low energy state, photons of EUV light are emitted.

Parabolic mirror 113 is disposed adjacent to the xenon gas emitting part. Parabolic mirror 113 focuses the EUV light generated by plasma. Parabolic mirror 113 composes a focusing optics system, and is disposed so that the focal position is adjacent to the location from which xenon gas is emitted from nozzle 112. EUV light is reflected by the multilayer film of parabolic mirror 113, passes through window 111 on vacuum chamber 110 and arrives at condenser mirror 114. Condenser mirror 114 focuses EUV light onto reflective-type reticle 57, reflecting it. EUV light is reflected by condenser mirror 114, illuminating a specific part of reticle 57. That is to say, parabolic mirror 113 and condenser mirror 114 compose the illumination system of this apparatus.

Reticle 57 has a multilayer film that reflects EUV light and an absorptive pattern layer for forming the pattern. By the reflecting of EUV light with reticle 57, the EUV light is "patterned." Patterned EUV light reaches wafer 103 through projection system 101.

The imaging optics system 101 of this embodiment comprises 4 mirrors: a concave first mirror 115a, a convex second mirror 115b, a convex third mirror 115c and a concave fourth mirror 115d. Each mirror 115a~115d is equipped with a multilayer film that reflects EUV light.

The EUV light reflected from reticle 57 is reflected sequentially from first mirror 115a through to fourth mirror 115d, forming a reduced (for example, ¼, ⅕, ⅙) image of the reticle 57 pattern. Image optics system 101 is made to be telecentric on the image side (wafer 103 side).

Reticle 57 is supported on at least the X-Y plane by movable reticle stage 11. Wafer 103 is preferably supported in the X, Y and Z directions by a movable wafer stage 105. When the die on wafer 103 is exposed, EUV light is exposed to a specific region on reticle 57 by the illumination system, and reticle 57 and wafer 103 are moved relative to image optics system 101 at a specified speed according to the reduction ratio of image optics system 101. In this manner, the reticle 57 pattern is exposed in the specified exposure area (toward the die) on wafer 103.

At time of exposure, it is desirable that wafer 103 be disposed behind a partition 116 so that the gas that is generated from the resist on wafer 103 not influence mirrors 115a~d of image optics system 101. Partition 116 has an opening 116a, and EUV light is exposed through it from mirror 115d to wafer 103. The space inside partition 116 is evacuated by vacuum pump 117. In this manner, refuse in the form of gas generated by illuminating the resist is prevented from adhering to mirrors 115a~d or to reticle 37. For that reason, deterioration of the optical properties thereof is prevented.

With the exposure apparatus of this embodiment, reticle 57 can be reliably adhered to the lower surface of static chuck 43, so a highly reliable exposure apparatus can be obtained.

Also, conveyance of reticle 57 is performed by the above substrate conveyor apparatus, so a high-yield product can be obtained using a reticle 57 with less contamination.

Supplementary Items of The Embodiment

We have explained the present invention by the above embodiment so far. The technological scope of the present invention shall not be limited to the above embodiment, the following shall be acceptable as well.

Figure 12:
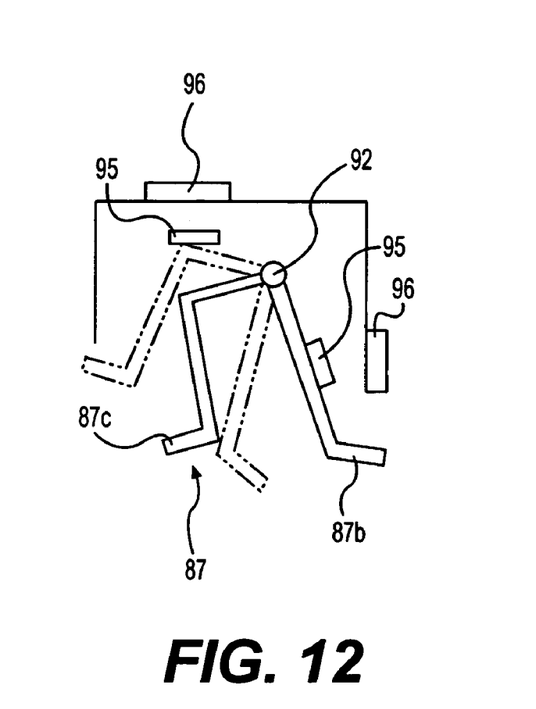
FIG. 12 is an illustration showing another example of a method for retaining a loss prevention member.

(1) In the above embodiment, we explained an example where retention of the rotation position of loss prevention member 87 is done by a toggle mechanism using a hinge 92 and a coil spring 93; however, it is acceptable for example to fix a permanent magnet 95 to loss prevention member 87 and to attract this permanent magnet 95 to the ferromagnetic unit 96 side, as shown in FIG. 12.

Figure 13:
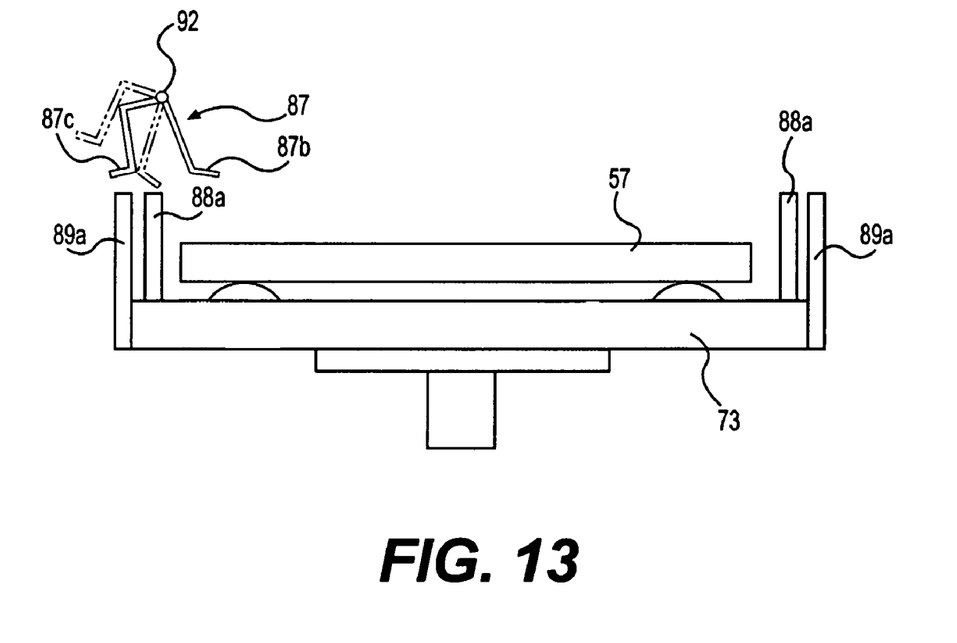
FIG. 13 is an illustration showing another example of a retention member and a release member.

(2) In the above embodiment, we explained an example where retention member 88 is fixed to coarse motion stage 83 and release member 89 is fixed to base member 73 of CFP 61; however, it is acceptable for example to fix retention member 88A and release member 89A to base member 73. Also, it is acceptable to fix retention members or release members to up-down table 47.

(3) For the above embodiment, we explained an example of an exposure apparatus that uses EUV light, but other than this it is also acceptable to broadly apply an exposure apparatus using charged particle rays, i-line, g-line, KrF, ArF, F2 and the like.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A substrate conveyor apparatus comprising:
a movable stage configured to move in the horizontal direction;
a conveyor arm configured to carry a substrate;
a chuck having an adhesion surface that faces down for holding the substrate; and
a fixed blind below the movable stage;
wherein the movable stage moves in the horizontal direction in a position separated from the fixed blind,
wherein the conveyor arm, in a first configuration, carries the substrate wherein the substrate is housed in a protection pod comprising a base member and a cover member, and
wherein the conveyor arm, in a second configuration, carries the substrate wherein the base member is separated from the cover member.

2. The substrate conveyor apparatus described in claim 1, further comprising:
an up-down table positionable below the movable stage and within the movement range of the movable stage, and wherein the conveyor arm is configured to carry the substrate to the up-down table.

3. The substrate conveyor apparatus described in claim 2, further comprising:
measurement means for measuring the force operating on the up-down table.

4. The substrate conveyor apparatus described in claim 1, further comprising:
a loss prevention means for preventing the dropping in error of the substrate adhered to the chuck.

5. The substrate conveyor apparatus described in claim 4, further comprising an up-down table positionable below the movable stage and within the movement range of the movable stage, wherein the loss prevention means comprises:
a retractable loss prevention member on the movable stage side,
a substrate retention means for rotating the loss prevention member into a retention position to hold the substrate adhered to the chuck with the loss prevention member, and
a release means for rotating the loss prevention member in to a release position by raising the up-down table to release the retention of the substrate by the loss prevention member.

6. The substrate conveyor apparatus described in claim 5, wherein
the release means comprises a release member that extends, facing up, from the base member of the protection pod.

7. The substrate conveyor apparatus described in claim 5, wherein:
the movable stage comprises a fine motion table and a coarse motion stage below the fine motion table, the moveable stage being moveable up and down and the chuck being below the fine motion table, and
the substrate retention means comprises a retention member that extends facing down from the coarse motion stage.

8. The substrate conveyor apparatus described in claim 5, further comprising:
a loss prevention member retention means for holding the loss prevention member in the retention position or the release position of the substrate.

9. The substrate conveyor apparatus described in claim 8 wherein the loss prevention member retention means comprises a toggle mechanism using a hinge and a spring.

10. The substrate conveyor apparatus described in claim 8, wherein the loss prevention member retention means holds the loss prevention member by magnetic force.

11. An exposure apparatus comprising the substrate conveyor apparatus described in claim 1.

12. The substrate conveyor apparatus of claim 1, wherein the chuck is a static chuck.

13. A substrate conveyor apparatus comprising:
a movable stage configured to move in the horizontal direction;
a chuck having an adhesion surface that faces down for holding a substrate;
a fixed blind below the movable stage;
an up-down table; and
a loss prevention means for preventing the dropping in error of the substrate adhered to the chuck, the loss prevention means comprising:
a retractable loss prevention member on the movable stage side;
a substrate retention means for rotating the loss prevention member into a retention position to hold the substrate adhered to the chuck with the loss prevention member; and
a release means for rotating the loss prevention member into a release position by raising the up-down table to release the retention of the substrate by the loss prevention member,
wherein the movable stage moves in the horizontal direction in a position separated from the fixed blind.

14. The substrate conveyor apparatus of claim 13, further comprising:
a conveyor arm configured to carry the substrate to the up-down table,
wherein the up-down table is positionable below the movable stage and within the movement range of the movable stage.

15. The substrate conveyor apparatus of claim 14, wherein:
the conveyor arm, in a first configuration, carries the substrate wherein the substrate is housed in a protection pod comprising a base member and a cover member; and
the conveyor arm, in a second configuration, carries the substrate wherein the base member is separated from the cover member.

16. The substrate conveyor apparatus of claim 13, further comprising:
measurement means for measuring the force operating on the up-down table.

17. The substrate conveyor apparatus of claim 13, wherein the release means comprises a release member that extends, facing up, from the base member of the protection pod.

18. The substrate conveyor apparatus of claim 13, wherein:
the movable stage comprises a fine motion table and a coarse motion stage below the fine motion table, the moveable stage being moveable up and down and the chuck being below the fine motion table, and
the substrate retention means comprises a retention member that extends facing down from the coarse motion stage.

19. The substrate conveyor apparatus of claim 13, further comprising:
a loss prevention member retention means for holding the loss prevention member in the retention position or the release position of the substrate.

20. The substrate conveyor apparatus of claim 19, wherein the loss prevention member retention means comprises a toggle mechanism using a hinge and a spring.

21. The substrate conveyor apparatus of claim 19, wherein the loss prevention member retention means holds the loss prevention member by magnetic force.

22. The substrate conveyor apparatus of claim 13, wherein the chuck is a static chuck.

23. An exposure apparatus comprising the substrate conveyor apparatus described in claim 13.

24. A substrate conveyor apparatus comprising:
a movable stage configured to move in the horizontal direction;
a chuck having an adhesion surface that faces down for holding a substrate;
a fixed blind below the movable stage;
an up-down table positionable below the movable stage and within the movement range of the movable stage; and
a conveyor arm configured to carry the substrate to the up-down table,
wherein the movable stage moves in the horizontal direction in a position separated from the fixed blind,
wherein the conveyor arm, in a first configuration, moves from a load-lock cell to the up-down table, and
wherein the conveyor arm, in a second configuration, moves from the up-down table to the load-lock cell.

25. The substrate conveyor apparatus of claim 24, wherein the conveyor arm, in the first configuration, further moves to an intermediate stage that is between the load-lock cell and the up-down table.

26. The substrate conveyor apparatus of claim 25, wherein the conveyor arm, in the first configuration, moves the substrate, housed in a protection pod comprising a base member and a cover member, from the load-lock cell to the intermediate stage, and moves the substrate and the base member from the intermediate stage to the up-down table.

27. The substrate conveyor apparatus of claim 24, wherein the conveyor arm, in the second configuration, further moves to an intermediate stage that is between the up-down table and the load-lock cell.

28. The substrate conveyor apparatus of claim 27, wherein the conveyor arm, in the second configuration, moves the substrate, on a base member, from the up-down table to the intermediate stage, and moves the substrate, housed in a protection pod comprising the base member and a cover member, from the intermediate stage to the load-lock cell.

29. The substrate conveyor apparatus of claim 24, wherein the substrate is a reticle.

30. The substrate conveyor apparatus of claim 24, wherein the conveyor arm moves, in the first configuration and the second configuration, a substrate on a base member, wherein the base member protects a surface of the substrate.

31. An exposure apparatus comprising the substrate conveyor apparatus described in claim 24.

* * * * *